United States Patent [19]

Schade, Jr.

[11] 4,034,307
[45] July 5, 1977

[54] CURRENT AMPLIFIER

[75] Inventor: Otto Heinrich Schade, Jr., North Caldwell, N.J.

[73] Assignee: RCA Corporation, New York, N.Y.

[22] Filed: Feb. 4, 1976

[21] Appl. No.: 655,163

[52] U.S. Cl. .................................. 330/35; 323/4; 330/22; 330/28; 330/30 R; 330/51

[51] Int. Cl.$^2$ .......................................... H03F 3/16

[58] Field of Search ............... 323/2, 4; 330/19, 22, 330/30 R, 35, 28, 51

[56] References Cited
UNITED STATES PATENTS 3,855,541  12/1974  Leidich ................................. 330/22

Primary Examiner—Rudolph V. Rolinec
Assistant Examiner—Lawrence J. Dahl
Attorney, Agent, or Firm—H. Christoffersen; S. Cohen; A. L. Limberg

[57] ABSTRACT

A current amplifier (CMA) having plurality of input terminals and an output terminal. Each input circuit and the output circuit of the CMA includes the conduction path of a separate one of a plurality of transistors. Means are provided for applying substantially the same potential to the control electrode of each of these transistors, which means includes an input-terminal-to-control-electrode degenerative feedback connection for each of the transistors having its conduction path in an input circuit. By including a unilaterally conductive device in such an input-terminal-to-control-electrode feedback connection, saturation of the transistor associated therewith caused by certain input current conditions is forestalled.

34 Claims, 2 Drawing Figures

CURRENT AMPLIFIER

Current mirror amplifiers (CMA's) are widely used to realize integrated circuit bias-current sources. A characteristic of such CMA's of special importance in this use is the fixed relationship which normally exists between the current available at its output terminal and that supplied to its input terminal. However, if the current source is required to supply bias currents over a large amplitude range, as in some forms of current-to-frequency converters, where the highest value of current may have to be one or more orders of magnitude greater than the lowest value of bias current, the practical realization of the bias current source in this way begins to become difficult.

In more detail, the input terminal of a CMA is normally biased from a current source, generally a large valued resistor. When small CMA output currents are desired, a resistance may be required whose value is too large to accurately realize in integrated circuit form. Because of accuracy and temperature stability requirements, it may be uneconomical to realize the required resistance in discrete form external to the integrated circuit if its value is very large. One solution to this problem is to employ a lower value bias resistor that is easy to integrate and to select a value of CMA gain such that the output current is a small fraction of the input current. Larger output currents may be obtained by biasing the CMA from a plurality of current sources.

This approach has a possible shortcoming. If a high value of output current is desired, the bias current source is switched to a lower resistance value. However, because the mirror gain ratio may be much less than unity to make possible currents at the low end of the range, as discussed above, an input current which is very large compared to the output current will have to be supplied at the high end of the range. This can be objectionable because it can result in excessive power dissipation and power supply loading.

An alternative approach to realizing a bias current source having a wide range of output currents is to utilize a plurality of CMA's whose output terminals are connected at a common point. Then the mirror having the desired gain ratio may be selected as a function of the desired output current. This approach also has disadvantages. The capacitive loading caused by the interconnection of the CMA output terminals may have an undesired effect on the response time of the utilization circuitry coupled to the CMA's. In addition, use of a plurality of CMA's may require an excessive number of devices, especially where each CMA has multiple output terminals.

In CMA's embodying the invention, the input current is one input circuit to a CMA is employed to open a feedback loop in another input circuit to the CMA. Each input circuit may exhibit a different transconductance so that the one or ones which have closed feedback loops determine the input to output current gain of the CMA.

Figure 1:
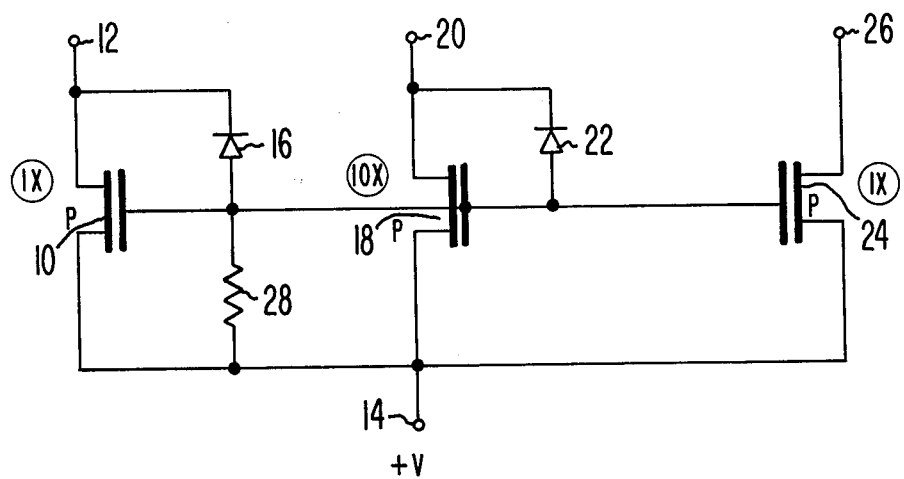
FIG. 1 is a schematic circuit diagram of one embodiment of the invention.
Figure 2:
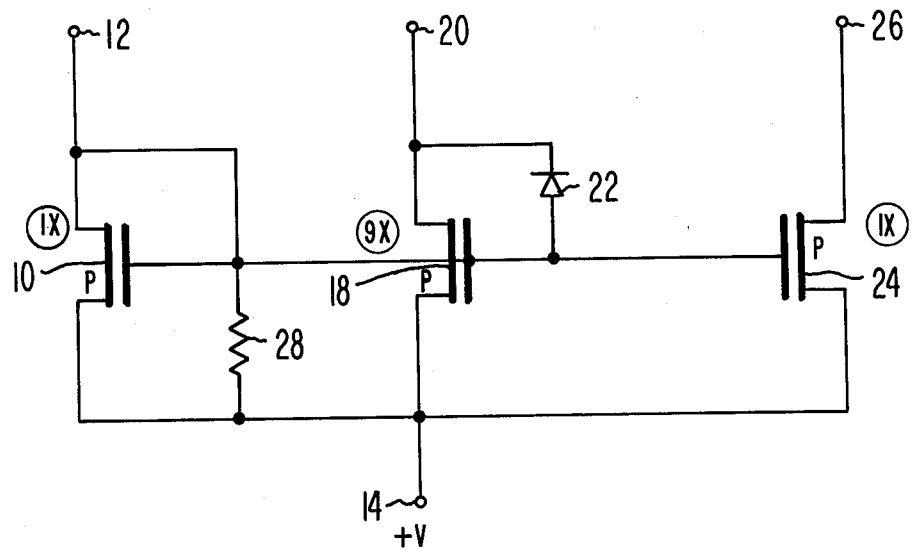
FIG. 2 is a schematic circuit diagram of a second embodiment of the invention.

In FIGS. 1 and 2 the transistors are all of enhancement mode, P channel metal-oxide-semiconductor (PMOS) type. Referring to FIG. 1, the drain-source path of transistor 10 is connected between first input terminal 12 and terminal 14 to which an operating voltage +V is applied. The cathode of diode 16 is connected to terminal 12 while its anode is connected to the gate of transistor 10. The drain-source path of transistor 18 is connected between second input terminal 20 and terminal 14. The cathode of diode 22 is connected to terminal 20 while its anode is connected to the gate of transistor 18. The drain-source path is transistor 24 is connected between output terminal 26 and terminal 14. The gates of transistors 10 and 18 are connected to the gate of output transistor 24. Resistor 28 is connected between terminal 14 and the commonly connected gate electrodes of transistors 10, 18 and 24.

In a CMA, the mirror again is proportional to the transconductances of its individual transistors. In FIG. 1, the circled numbers 10X and 1X have been assigned, by way of example, to transistors 18 and 24, respectively, which represent the relative transconductances of these devices. This indicates that the input-output current ratio for the CMA utilizing these two transistors is 10:1. For MOS devices having similar doping characteristics, the transconductance is proportional to the ratio W/L where W is the conduction path width and L is the conduction path length of each transistor. A common technique for controlling the transconductance of an MOS device is to maintain the channel length constant and to vary the channel width.

In the operation of the circuit of FIG. 1, assume initially that the current drawn from input terminal 20 is more than ten times larges than the current drawn from input terminal 12. A given gate-to-source voltage is developed in transistor 18 to support the flow of current through terminal 20. (The source of transistors 10, 18 and 24 is the one connected to common terminal 14). This voltage (which appears also across resistor 28) is also applied across the gate-source electrodes of transistor 10. Transistor 10 is thus biased at a level that will support a current through it equal to one-tenth the current through terminal 20. However, the current through transistor 10 via input terminal 12 is less than one-tenth the terminal 20 current. Such a condition, where a transistor is conditioned to accept a current that is greater than that actually supplied to it, results in saturation of the device.

When saturation occurs, the voltage at the drain of transistor 10 (the drain is connected to terminal 12) rises towards the voltage +V present at terminal 14 and becomes more positive than the voltage at the gate of transistor 10. This reverse biases diode 16 thereby opening the drain-gate feedback path which, in turn, effectively removes transistor 10 from the CMA input circuit. As a result of the opening of its drain-gate feedback path, the gate to source voltage of transistor 10 is no longer determined by its degree of conduction. This voltage instead is determined by the gate-source voltage of transistor 18, being equal thereto. The circuit 18, 22, in effect, operates as the input circuit of the CMA. (It serves the same functions as the input diode of a more conventional CMA). The voltage developed between the source and gate electrodes of transistor 18 is applied across the gate-source of transistor 24, and it is this voltage (and the 10:1 transconductance ratio between transistors 18 and 24) which determines the CMA output current. Because the current through transistor 10 has no effect on its gate-source voltage, this transistor has no effect on the CMA output current. Therefore, this transistor 10 can be considered to be effectively removed from the CMA input circuit (it is as if this transistor were not present - even though it continues to conduct the current it receives from terminal 12).

The requirement that the current at terminal 20 be more than ten times the current at terminal 12 is due to the relative transconductances of transistors 18 and 10. A unit of current supplied to transistor 10 causes a particular gate-source voltage drop. The same unit of current supplied to transistor 18 causes corresponding voltage drop whose value is less than that associated with transistor 10. To ensure saturation of the desired transistor, in this case 10, a current must be supplied to the active transistor, in this case 18, whose value is large enough to cause the gate-source voltage of transistor 18 to be greater than the gate-source voltage of transistor 10. This means that the current to transistor 18 is greater than the current supplied to transistor 10 multiplied by the relative transconductances of the two transistors, in this case, 10. Similarly, to saturate transistor 18, a current must be supplied to transistor 10 whose value is greater than one-tenth that supplied to transistor 18.

Resistor 28 is a resistance whose value is not critical and is only needed to provide a small amount of leakage current to the diodes to avoid the possibility of having the circuit latch-up to a particular bias condition. (Alternatively, this resistor may be replaced by a different circuit which permits a leakage as, for example, a resistor of a smaller value serially connected with a voltage dropping device such as a diode connected MOS transistor). For the above-described input conditions, the CMA input-to-output current gain ratio is 10:1, that is, the output current withdrawn at terminal 26 is 1/10 the input current withdrawn from terminal 20.

Now let the current at input terminal 12 be greater than one-tenth that withdrawn from terminal 20. Transistor 18 saturates, reverse biasing diode 22 and opening its drain-gate feedback path thereby effectively removing transistor 18 from the CMA input circuit. For this input condition, the CMA current gain ratio is 1:1.

By selecting the desired input, a particular CMA gain ratio is realized. The 10:1 gain ratio may be selected to supply small values of output current while the 1:1 ratio may be selected for larger values of output current.

If diodes 16 and 22 were not present in the circuit of FIG. 1, that is, if each was replaced by a short circuit, the circuit would not function in the desired manner for terminals 12 and 20 would be shorted together. In such a case an input current at either input terminal 12 or 20 flows through the drain-source path of both transistors 10 and 18, resulting in a gain ratio of 11:1.

FIG. 2 shows a variable gain CMA which utilizes one less component than the circuit of FIG. 1. The circuit of FIG. 1 has been modified by replacing diode 16 with a short circuit. All other connections and reference designations are unchanged. In the operation of the circuit of FIG. 2, assume initially that the current through terminal 12 is greater than one-ninth the current through terminal 20. As described in conjunction with the circuit of FIG. 1, transistor 18 saturates, reverse biasing diode 22 thereby removing transistor 18 from the mirror input circuit. As a result, the CMA gain is 1:1. Now let the current through terminal 20 be greater than nine times that through terminal 12. As discussed earlier in conjunction with the need for diodes 16 and 22, current flows through terminal 20, through the drain-source path of transistor 18 as well as the drain-source path of transistor 10. Thus, both transistors operate as active input circuits and the sum of their transconductances determines the CMA gain for a given bias condition. However, the transconductance of transistor 18 in the circuit of FIG. 2 has been selected such that the combination of transistors 10 and 18 yields the desired 10:1 CMA gain ratio (note the circled numbers, 9 for transistor 18 and 1 for transistor 10).

FIGS. 1 and 2 disclose CMA circuits having selectable current gains that avoid the earlier discussed problems associated with the prior art circuits. These gains may be greater than, less than, or equal to unity. The principles disclosed herein are in no way limited to circuits having only two input terminals and a single output terminal. Nor is the application limited to circuits using PMOS transistors. The circuits of FIGS. 1 and 2 may be realized, with a suitable modification of the operating voltage, with NMOS, PNP bipolar or NPN bipolar transistors. When realized using bipolar devices, leakage current source resistor 28 is not required.

What is claimed is:

1. A current mirror amplifier having an output terminal, a common terminal and first and second input terminals, comprising in combination:
    first, second and third transistors, each having first and second electrodes, a control electrode and a controlled conduction path between said first and second electrodes, the conductance of said path being responsive, in accordance with a predetermined transconductance, to potential between said second and control electrodes, the second electrode of each transistor connected to said common terminal and the first electrodes of said first, second and third transistors being connected to said first and second input terminals and said output terminal respectively, said first and second input terminals being respectively receptive of first and second input currents, and the control electrode of each transistor connected to a common node;
    a first feedback path between the first and control electrodes of said first transistor;
    a second feedback path connected between the first and control electrodes of said second transistor, said second feedback path including unilaterally conductive means, responsive to the relative magnitudes of the first and second input currents, for substantially disabling said second feedback path when the ratio of the magnitude of said first input current to the magnitude of said second input current is appreciably larger than the ratio of the transconductances of said first transistor to the transconductance of the said second transistor.

2. The combination as set forth in claim 1 wherein said first, second and third transistors comprise metal-oxide-semiconductor transistors.

3. The combination of claim 1 wherein said first feedback path includes second unilaterally conductive means, responsive to the relative magnitudes of said first and second input currents, for substantially disabling said first feedback path when the ratio of the magnitude of said first input current to the magnitude of said second input current is appreciably smaller than the ratio of said first transistor transconductance to said second transistor transconductance.

4. The combination as set forth in claim 3 wherein said first and second unilaterally conductive means respectively comprise first and second diodes.

5. A current mirror amplifier having an input-to-output current gain which can be switched between different values comprising, in combination:
at least first and second input terminals, an output terminal and a common terminal, said first and second input terminals respectively being receptive of first and second input currents;
first, second and third transistors, at least said first and second exhibiting different transconductances, each transistor having a conduction path terminated at one end by an input electrode, and at its other end by an output electrode, and a control electrode for controlling the conductance of said conduction path, each transistor connected at its input electrode to said common electrode, said first transistor connected at its output electrode to said first input terminal, said second transistor connected at its output electrode to said second input terminal and said third transistor connected at its output electrode to said output terminal, and all control electrodes connected to a common circuit node;
a first feedback circuit between the control and output electrodes of said first transistor; and
a second feedback circuit connected between the control and output electrodes of said second transistor, said second feedback path including unilaterally conductive means, responsive to the relative magnitudes of the first and second input currents, for enabling said second feedback circuit when the ratio of the magnitude of said first input current to the magnitude of second input current is appreciably smaller than the ratio of the transconductance of said first transistor to the transconductance of said second transistor, and disabling said second feedback circuit when the said ratio of input current magnitudes is appreciably larger than said ratio of transconductances.

6. A current mirror amplifier as set forth in claim 5, wherein said means in said second feedback circuit comprises a diode.

7. The combination of claim 5 wherein said first feedback circuit includes a second unilaterally conductive means, responsive to the relative magnitudes of said first and second input currents, for enabling said first feedback circuit when the ratio of the magnitude of said first and second input currents is appreciably smaller than said ratio of transconductances and disabling said first feedback circuit when said ratio of current magnitude exceeds said ratio of transconductances.

8. A current mirror amplifier as set forth in claim 7, wherein said means in said first feedback circuit comprises a diode.

9. A current mirror amplifier as set forth in claim 5 wherein all of said transistors are MOS transistors of the same conductivity type, said input electrodes comprising source electrodes, said output electrodes drain electrodes, and said control electrodes gate electrodes.

10. A current mirror amplifier as set forth in claim 9 further including a resistance connected between said common node and said common terminal.

11. In a current mirror amplifier of the type having a plurality of input circuits and an output circuit, said input circuits having characteristic transconductances and being adapted for respective currents to flow therethrough, the improvement wherein:
at least one of said input circuits includes switching means, responsive to the relative magnitudes of the currents flowing through said input circuits, for switching said one input circuit into a first operational state in which the transconductance of said one input circuit affects the gain of said mirror when any of the respective ratios of the current flowing through said one input circuit to the respective currents flowing through the other input circuits is in excess of predetermined ratios in accordance with the respective ratios of the transconductance of said one input circuit to said other input circuits, and for switching said one input circuit to a second operational state wherein the transconductance of said one input circuit does not affect the gain of said mirror when all of said ratios of currents do not exceed said predetermined ratios.

12. The combination as set forth in claim 11 wherein said current mirror amplifier includes a plurality of input terminals and a common terminal, each of said input circuits connected between said common terminal and a corresponding one of said input terminals, said one input circuit comprising a transistor having input and output electrodes defining the ends of a conduction path and a control electrode, said input terminal being connected to said output electrode and said common terminal being connected to said input electrode,
said one input circuit further comprising a feedback path connected between said output electrode and said control electrode, said feedback path including means for selectively opening and closing said feedback path.

13. The combination as set forth in claim 12, wherein said means for opening and closing comprises a diode.

14. The combinaton as set forth in claim 12 wherein said transistor comprises a metal-oxide-semiconductor transistor.

15. A current mirror amplifier comprising:
first and second and third transistors of the same conductivity type, each having first and second and control electrodes and having a controllable conduction path between its first and second electrodes the conductance of which is controlled responsive to the potential between its second and control electrodes;
first and second input terminals for receiving first and second input currents, respectively, to which the first electrodes of said first and said second transistors are respectively connected;
an output terminal to which the first electrode of said third transistor is connected;
a common terminal of which the second electrodes of said first and second and third transistors are each connected;
a shared node;
means for applying potential at said shared node to the control electrode of said third transistor;
means for completing a degenerative feedback loop including said first transistor, also including
means for applying potential at said shared node to the control electrode of said first transistor and including
means for connecting the first electrode of said first transistor to said shared node;

means for selectively completing a degenerative feedback loop including said second transistor, also including means for applying a potential at said shared node to the control electrode of said second transistor and including unilaterally conductive means for connecting the second electrode of said second transistor to said shared node only so long as the current flowing through the controllable conduction path of said second transistor responsive to potential at said shared node does not tend to exceed said second input current.

16. A current amplifier as set forth in claim 15 wherein said means for connecting the first electrode of said second transistor to said shared node only s long as the current flowing through said controllable path of said second transistor does not tend to exceed said second input current includes means for unilaterally conducting current connected between the second electrode of said second transistor and said shared node.

17. A current mirror amplifier as set forth in claim 16 wherein said means for unilaterally conducting current comprises a semiconductor junction with first and second electrodes, the second electrode of said second transistor being connected to the first electrode of said semiconductor junction and the second electrode of said semiconductor junction being connected to said shared node.

18. A current mirror amplifier as set forth in claim 17 wherein said first and second and third transistors are of enhancement-mode field effect type and wherein a resistance connects said shared node to said common terminal.

19. A current mirror amplifier as set forth in claim 16 wherein said first and said second transistors have different transconductances for similar potential between their first and control electrodes.

20. A current amplifier comprising:
first and second and third transistors of the same conductivity type, each having first and second and control electrodes and having a controllable conduction path between its first and second electrodes the conductance of which is controlled responsive to the potential between its second and control electrodes;
first and second input terminals for receiving first and second input currents, respectively, to which the first electrodes of said first and said second transistors are respectively connected;
an output terminal to which the first electrode of said third transistor is connected;
a common terminal to which the second electrodes of said first and second and third transistors are each connected;
a shared node;
means for applying potential at said shared node to the control electrode of said third transistor;
means for selectively completing a degenerative feedback loop including said first transistor, also including
means for applying potential at said shared node to the control electrode of said first transistor and including
first unilaterally conductive means for connecting the first electrode of said first transistor to said shared node only so long as the current through the controllable conduction path of said first transistor flowing responsive to potential at said shared node does not tend to exceed said first input current;

means for selectively completing a degenerative feedback loop including said second transistor, also including means for applying a potential at said shared node to the control electrode of said second transistor and including second unilaterally conductive means for connecting the first electrode of said second transistor to said shared node only so long as the current through the controllable conduction path of said second transistor flowing responsive to potential at said shared node does not tend to exceed said second input current.

21. A current mirror amplifier as set forth in claim 20 wherein said first means for unilaterally conducting current comprises a semiconductor junction with first and second electrodes, the second electrode of said first transistor being connected to the first electrode of said semiconductor junction and the second electrode of said semiconductor junction being connected to said shared node.

22. A current mirror amplifier as set forth in claim 20 wherein said second means for unilaterally conducting current comprises a semiconductor junction with first and second electrodes, the second electrode of said second transistor being connected to the first electrode of said semiconductor junction and the second electrode of said semiconductor junction being connected to said shared node.

23. A current mirror amplifier as set forth in claim 22 wherein said first and second and third transistors are of enhancement-mode field effect type and wherein a resistance connects said shared node to said common terminal.

24. A current mirror amplifier as set forth in claim 20 wherein said first and said second transistors have different transconductances for similar potential between their first and control electrodes.

25. A current amplifier comprising:
a plurality of input transistors and at least one output transistor of the same conductivity type, each having first and second and control electrodes and having a controllable conduction path between its first and second electrodes the conductance of which is controlled responsive to the potential between its second and control electrodes;
a plurality of input terminals, each of which has a respective one of the first electrodes of said plurality of input transistors connected thereto, for receiving respective input currents;
a respective output terminal at the first electrode of each said output transistor;
a common terminal to which the second electrodes of said input and output transistors are each connected;
a shared node;
means applying potential at said shared node to the control electrode of each of said input and output transistors;
means connecting the second electrode of a first of said plurality of input transistors to said shared node; and
respective means selectively connecting the first electrode of each other of said plurality of input transistors to said shared node only so long as the current flowing through the controllable conduction path of that other transistor responsive to potential at said shared node does not tend to exceed the input current applied to the input terminal to which the first electrode of that other transistor connects.

26. A current amplifier as set forth in claim 25 wherein said means for connecting the first electrodes of said others of transistors to said shared node only so long as the current flowing through the controllable paths of said transistor does not tend to exceed said input currents applied to the first electrodes of said other transistor includes means for unilaterally conducting current connected between the second electrode of said second transistor and said shared node.

27. A current amplifier as set forth in claim 26 wherein said means for unilaterally conducting current comprises a semiconductor junction with first and second electrodes, the second electrode of said second transistor being connected to the first electrode of said semiconductor junction and the second electrode of said semiconductor junction being connected to said shared node.

28. A current amplifier as set forth in claim 27 wherein said first and second and third transistors are of enhancement-mode field effect type and wherein a resistance connects said shared node to said common terminal.

29. A current amplifier as set forth in claim 26 wherein said first and said second transistors have different transconductances for similar potential between their first and control electrodes.

30. A current amplifier comprising:
a plurality of input transistors and at least one output transistor of the same conductivity type, each having first and second and control electrodes and having a controllable conduction path between its first and second electrodes the conductance of which is controlled responsive to the potential between its second and control electrodes;
a plurality of input terminals, each of which has a respective one of the first electrodes of said plurality of input transistors connected thereto, for receiving respective input currents;
a respective output terminal at the first electrode of each said output transistor;
a common terminal to which the second electrodes of said input and output transistors are each connected;
a shared node;
means applying potential at said shared node to the control electrode of each of said input and output transistors;
respective means selectively connecting the first electrode of each of said plurality of input transistors to said shared node only so long as the current flowing through the controllable conduction path of that transistor responsive to potential at said shared node does not tend to exceed the input current applied to the input terminal to which the first electrode of that transistor connects.

31. A current amplifier as set forth in claim 30 wherein said means for connecting the first electrode of said others of transistors to said shared node only so long as the current flowing through the controllable paths of said transistor does not tend to exceed said input currents applied to the first electrodes of said other transistor includes means for unilaterally conducting current connected between the second electrode of said second transistor and said shared node.

32. A current amplifier as set forth in claim 31 wherein said means for unilaterally conducting current comprises a semiconductor junction with first and second electrodes, the second electrode of said second transistor being connected to the first electrode of said semiconductor junction and the second electrode of said semiconductor junction being connected to said shared node.

33. A current amplifier as set forth in claim 32 wherein said first and second and third transistors are of enhancement-mode field effect type and wherein a resistance connects said shared node to said common terminal.

34. A current amplifier as set forth in claim 31 wherein said first and said second transistors have different transconductances for similar potential between their first and control electrodes.

* * * * *

UNITED STATES PATENT OFFICE
CERTIFICATE OF CORRECTION

PATENT NO. : 4,034,307

DATED : July 5, 1977

INVENTOR(S) : Otto Heinrich Schade, Jr.

It is certified that error appears in the above-identified patent and that said Letters Patent are hereby corrected as shown below:

Column 5, line 39, cancel "the".

Column 6, line 56, change "of" (first occurrence) to --to--.

Column 7, line 16, change "s" to --so--.

Signed and Sealed this

Thirteenth Day of December 1977

[SEAL]

Attest:

RUTH C. MASON
Attesting Officer

LUTRELLE F. PARKER
Acting Commissioner of Patents and Trademarks